United States Patent
Takeuchi et al.

(10) Patent No.: US 9,977,733 B2
(45) Date of Patent: May 22, 2018

(54) MEMORY CONTROLLER, DATA STORAGE DEVICE AND MEMORY CONTROL METHOD USING DATA UTILIZATION RATIO

(75) Inventors: Ken Takeuchi, Tokyo (JP); Kousuke Miyaji, Tokyo (JP); Koh Johguchi, Tokyo (JP); Hiroki Fujii, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 414 days.

(21) Appl. No.: 14/378,157

(22) PCT Filed: Mar. 30, 2012

(86) PCT No.: PCT/JP2012/058586
§ 371 (c)(1),
(2), (4) Date: Aug. 29, 2014

(87) PCT Pub. No.: WO2013/121596
PCT Pub. Date: Aug. 22, 2013

(65) Prior Publication Data
US 2015/0006796 A1    Jan. 1, 2015

(30) Foreign Application Priority Data
Feb. 15, 2012 (JP) ................. 2012-030798

(51) Int. Cl.
*G06F 12/02* (2006.01)
*G06F 12/06* (2006.01)
(Continued)

(52) U.S. Cl.
CPC ...... *G06F 12/0246* (2013.01); *G06F 12/0238* (2013.01); *G06F 12/0638* (2013.01);
(Continued)

(58) Field of Classification Search
CPC ............. G06F 12/0246; G06F 12/0638; G06F 12/0238; G06F 2212/7202;
(Continued)

(56) References Cited

U.S. PATENT DOCUMENTS 6,836,432 B1 * 12/2004 Parker ................. G11C 11/5628
365/185.03
2006/0087893 A1    4/2006 Nishihara et al.
(Continued)

FOREIGN PATENT DOCUMENTS

JP    2006-018591 A    1/2006
JP    A-2006-236304    9/2006
(Continued)

OTHER PUBLICATIONS

Takashima et al., "A 128Mb ChainFeRAM™ and System Designs for HDD Application and Enhanced HDD Performance," *IEEE Asian Solid-State Circuit Conference*, 2009, pp. 13-16.
(Continued)

*Primary Examiner* — Michael Krofcheck
(74) *Attorney, Agent, or Firm* — Oliff PLC

(57) ABSTRACT

When a data utilization ratio R which is a utilization ratio of sectors in one page is not lower than a threshold value Rth1 and when write data is not frequently-rewritten data, a flash memory is controlled such that the write data is stored into the flash memory. When the data utilization ratio R which is the utilization ratio of sectors in one page is lower than the threshold value Rth1 or when the write data is frequently-rewritten data although the data utilization ratio R is not lower than the threshold value Rth1, a ReRAM is controlled such that the write data is stored into the ReRAM. This suppresses deterioration of the flash memory.

16 Claims, 4 Drawing Sheets

(51) Int. Cl.
*G11C 11/00* (2006.01)
*G11C 13/00* (2006.01)

(52) U.S. Cl.
CPC ........ *G11C 11/005* (2013.01); *G11C 13/0002* (2013.01); *G11C 13/0035* (2013.01); *G06F 2212/7201* (2013.01)

(58) Field of Classification Search
CPC ..... G06F 2212/7203; G06F 2212/1016; G06F 2212/1036; G06F 3/0679; G06F 3/068; G06F 3/0685; G06F 3/0649; G06F 3/0659; G06F 3/0611; G06F 3/0614; G06F 3/0616; G11C 11/005; G11C 14/009; G11C 14/0045; G11C 13/0035
See application file for complete search history.

(56) References Cited

U.S. PATENT DOCUMENTS

| | | | |
|---|---|---|---|
| 2008/0071973 A1* | 3/2008 | Chow | G06F 12/0246 711/103 |
| 2008/0126671 A1 | 5/2008 | Kashiwada | |
| 2009/0024787 A1 | 1/2009 | Yim | |
| 2010/0017555 A1* | 1/2010 | Chang | G06F 12/0246 711/103 |
| 2010/0257308 A1* | 10/2010 | Hsu | G06F 12/0246 711/103 |
| 2010/0312953 A1* | 12/2010 | Allen | G06F 12/0246 711/103 |
| 2011/0167197 A1 | 7/2011 | Leinwander | |
| 2011/0252187 A1* | 10/2011 | Segal | G06F 12/0246 711/103 |
| 2011/0289263 A1* | 11/2011 | McWilliams | G06F 12/0284 711/103 |
| 2013/0103889 A1* | 4/2013 | Jeong | G06F 12/0246 711/103 |
| 2015/0220273 A1* | 8/2015 | Sun | G06F 12/0238 711/103 |

FOREIGN PATENT DOCUMENTS

| | | |
|---|---|---|
| JP | A-2008-134685 | 6/2008 |
| JP | A-2012-8651 | 1/2012 |
| JP | A-2012-8747 | 1/2012 |
| KR | 20090109959 A | 10/2009 |

OTHER PUBLICATIONS

International Search Report issued in International Application No. PCT/JP2012/058586 dated Jun. 26, 2012.
Written Opinion of the International Searching Authority issued in International Application No. PCT/JP2012/058586 dated Jun. 26, 2012 (with translation).
International Preliminary Report on Patentability issued in International Application No. PCT/JP2012/058586 completed Jan. 22, 2014 (with translation).

* cited by examiner

Fig. 7

| Stored USFT | 0 | 1 | 1 | 1 | 1 | 1 | 1 | 1 |

| WSFT | 1 | 1 | 0 | 0 | 0 | 0 | 0 | 0 |

| Created USFT | 1 | 1 | 1 | 1 | 1 | 1 | 1 | 1 |

| Stored USFT | 0 | 0 | 0 | 0 | 0 | 0 | 0 | 0 |

| WSFT | 1 | 1 | 0 | 0 | 0 | 0 | 0 | 0 |

| Created USFT | 1 | 1 | 0 | 0 | 0 | 0 | 0 | 0 |

R=2/8=0.25

MEMORY CONTROLLER, DATA STORAGE DEVICE AND MEMORY CONTROL METHOD USING DATA UTILIZATION RATIO

TECHNICAL FIELD

The present invention relates to a memory controller, a data storage device and a memory control method. More specifically, the invention relates to a memory controller configured to control a first memory and a second memory, wherein the first memory is configured as a non-volatile memory in which data can be written by a writing operation that reads out data stored in a storage area in page unit consisting of a plurality of sectors, rewrites the read-out data in sector unit and subsequently writes data in page unit, and the second memory is configured as a random access memory, as well as to a data storage device including such a memory controller and a memory control method of controlling the first memory and the second memory.

BACKGROUND ART

A proposed configuration for this type of memory controller is to control an FeRAM (Ferroelectric Random Access Memory), which is a non-volatile random access memory serving as a cache memory to hold stored data even when power supply is cut off, or an HDD, such that data from a PC system is stored into the FeRAM or the HDD (for example, Non-Patent Literature 1). This device does not need to regularly save data of the FeRAM into the HDD as backup in case of an unexpected power shutdown. This accordingly enables data of a relatively large data volume to be stored in the FeRAM and enhances the cache hit ratio.

CITATION LIST

Non-Patent Literature

[NPL 1] Daisaburo Takashima et al., "A 128 Mb Chain-FeRAM™ and System Designs for HDD Application and Enhanced HDD Performance", IEEE Asian Solid-State Circuits Conference, Nov. 16-18, 2009, Taipei, Taiwan

SUMMARY OF INVENTION

A proposed configuration for an SSD (Solid State Drive) that stores data from a host device includes: a non-volatile memory such as NAND flash memory in which data is written by a writing operation that reads out data stored in each page consisting of a plurality of sectors, rewrites the read-out data in sector unit and subsequently writes the rewritten data in page unit; a random access memory such as ReRAM (Resistance Random Access Memory, resistance change memory) which data can be read out from and written in at a higher speed than the non-volatile memory; and a memory controller configured to control the non-volatile memory and the random access memory. Frequently performing the writing operation in the state that the number of sectors used for storage of data is reduced in one page causes data to be read out from and written into an area that is not used for storage of data under normal circumstances and leads to deterioration of the non-volatile memory mounted on this SSD.

The main object of the memory controller, the data storage device and the memory control method of the invention is to suppress deterioration of a non-volatile memory.

In order to accomplish the main object described above, the memory controller, the data storage device and the memory control method of the invention employs the following configurations.

A memory controller according to the present invention is a memory controller configured to control a first memory and a second memory, wherein the first memory is configured as a non-volatile memory in which data can be written by a writing operation that reads out data stored in a storage area in page unit consisting of a plurality of sectors, rewrites the read-out data in sector unit and subsequently writes data in page unit, and the second memory is configured as a random access memory in which data can be written at a higher speed than the first memory, the memory controller including: a controller configured to control the first memory and the second memory in response to input of write data and a write request signal to request for writing the write data, such that the input write data is written into the first memory by the writing operation when a data utilization ratio is not lower than a specified ratio and such that the input write data is stored into the second memory when the data utilization ratio is lower than the specified ratio, wherein the data utilization ratio denotes a ratio of size of sectors used for storage of the write data to size of a data storable area in a predefined range of the storage area in the case where the write data is written into the first memory.

The memory controller of this aspect controls the first memory and the second memory in response to input of write data and a write request signal to request for writing the write data, such that the input write data is written into the first memory by the writing operation when the data utilization ratio is not lower than the specified ratio and such that the input write data is stored into the second memory when the data utilization ratio is lower than the specified ratio. Herein the data utilization ratio denotes a ratio of size of sectors used for storage of the write data to size of a data storable area in a predefined range of the storage area in the case where the write data is written into the first memory. This enables the data utilization ratio per 1 page of the first memory to be equal to or higher than the specified ratio and reduces useless operations of reading from and writing into the storage area of the first memory that is not used for storage of data. This suppresses deterioration of the first memory. Herein the "predefined range" may be, for example, a range for data of one page or data of a plurality of pages corresponding to logic addresses of the write data or a range for data of a specified size that is greater than the size of a sector in a page corresponding to logic addresses of the write data.

According to one embodiment of the memory controller of the above aspect, the memory controller may include a ratio setter configured to set the specified ratio in such a tendency as to decrease with an increase in size of a storage area for storing data in the second memory. This accelerates storing the write data into the first memory in the state that the storage area usable for storing new data is reduced in the second memory.

According to another embodiment of the memory controller of the above aspect, the controller may control the first memory and the second memory, such that the input write data is stored into the second memory when the write data is frequently-written data which is written at a high frequency although the data utilization ratio is not lower than the specified ratio. Writing data into the first memory when the input write data is frequently-written data causes the writing operation to be performed at a high frequency and accelerates deterioration of the first memory. Accordingly, controlling the second memory to output the input data to the second memory and store the output data into the second memory, when the input write data is frequently-written data. This suppresses deterioration of the first memory. In this embodiment, The memory controller may include an address information storage unit configured to store a first number of logic address of the input write data when the data utilization ratio is not lower than the specified ratio, wherein the controller determines that the input write data is the frequently-written data when number of logic addresses of the input write data stored in the logic address information storage unit is not lower than a second number which is smaller than the first number.

According to another embodiment of the memory controller of the above aspect, the controller may calculate the page utilization ratio, based on used sector information which is information on whether each of the sectors stores data, and sectors used for storing the input write data. In this embodiment, when the page utilization ratio becomes equal to a second ratio higher than the specified ratio, the controller may specify information on whether each of the sectors stores data after the page utilization ratio becomes equal to the second ratio, as the used sector information. When the page utilization ratio is lower than the specified ratio, the first memory and the second memory are controlled, such that the input write data is stored into the second memory. Accordingly, as the page utilization ratio increases, data is not stored into the second memory but is continuously stored into the first memory. This may accelerate deterioration of the first memory and decreases the writing speed of data. When the page utilization ratio reaches the second ratio that is higher than the specified ratio, the information on whether each of the sectors stores data after the page utilization ratio reaches the second ratio is specified as the used sector information. This enables data to be stored again into the second memory, thus suppressing deterioration of the first memory and controlling the decrease of the writing speed of data.

According to another embodiment of the memory controller of the above aspect, in the case of storing the input write data into the second memory, when data corresponding to logic addresses of the input write data have already been stored in the storage area of the first memory, the controller may read out data stored in the first memory in page unit, rewrite data in each sector as a writing object in which the write data is to be written out of sectors of the read-out data and subsequently store the rewritten data in page unit into the second memory.

The first memory may be a NAND flash memory. This embodiment suppresses deterioration of the first memory when the first memory is a NAND flash memory. The second memory may be a resistance change memory. This embodiment suppresses deterioration of the first memory when the second memory is a resistance change memory.

According to another aspect, there is provided a data storage device, including: a memory controller according to any of the configurations described above, i.e., a memory controller basically configured to control a first memory and a second memory, wherein the first memory is configured as a non-volatile memory in which data can be written by a writing operation that reads out data stored in a storage area in page unit consisting of a plurality of sectors, rewrites the read-out data in sector unit and subsequently writes data in page unit, and the second memory is configured as a random access memory in which data can be written at a higher speed than the first memory, the memory controller including a controller configured to control the first memory and the second memory in response to input of write data and a write request signal to request for writing the write data, such that the input write data is written into the first memory by the writing operation when a data utilization ratio is not lower than a specified ratio and such that the input write data is stored into the second memory when the data utilization ratio is lower than the specified ratio, wherein the data utilization ratio denotes a ratio of size of sectors used for storage of the write data to size of a data storable area in a predefined range of the storage area in the case where the write data is written into the first memory; the first memory; and the second memory.

The data storage device of this aspect includes the memory controller having any of the configurations described above and accordingly has the advantageous effects of this memory controller, for example, the advantageous effect of suppressing deterioration of the first memory.

A memory control method according to the present invention is a memory control method of controlling a first memory and a second memory, wherein the first memory is configured as a non-volatile memory in which data can be written by a writing operation that reads out data stored in a storage area in page unit consisting of a plurality of sectors, rewrites the read-out data in sector unit and subsequently writes data in page unit, and the second memory is configured as a random access memory in which data can be written at a higher speed than the first memory, the memory control method including: controlling the first memory and the second memory in response to input of write data and a write request signal to request for writing the write data, such that the input write data is written into the first memory by the writing operation when a data utilization ratio is not lower than a specified ratio and such that the input write data is stored into the second memory when the data utilization ratio is lower than the specified ratio, wherein the data utilization ratio denotes a ratio of size of sectors used for storage of the write data to size of a data storable area in a predefined range of the storage area in the case where the write data is written into the first memory.

The memory control method of this aspect controls the first memory and the second memory in response to input of write data and a write request signal to request for writing the write data, such that the input write data is written into the first memory by the writing operation when the data utilization ratio is not lower than the specified ratio and such that the input write data is stored into the second memory when the data utilization ratio is lower than the specified ratio. Herein the data utilization ratio denotes a ratio of size of sectors used for storage of the write data to size of a data storable area in a predefined range of the storage area in the case where the write data is written into the first memory. This enables the data utilization ratio per 1 page of the first memory to be equal to or higher than the specified ratio and reduces useless operations of reading from and writing into the storage area of the first memory that is not used for storage of data. This suppresses deterioration of the first memory. Herein the "predefined range" may be, for example, a range for data of one page or data of a plurality of pages corresponding to logic addresses of the write data or a range for data of a specified size that is greater than the size of a sector in a page corresponding to logic addresses of the write data.

BRIEF DESCRIPTION OF DRAWINGS

FIG. 7 is a diagram illustrating an example of the used sector flag table USFT created without a reset operation of the used sector flag table USFT when the page utilization ratio R exceeds a threshold value Rth2; and FIG. 8 is a diagram illustrating an example of the used sector flag table USFT created with the reset operation of the used sector flag table USFT when the page utilization ratio R exceeds the threshold value Rth2.

DESCRIPTION OF EMBODIMENTS

Some aspects of the invention are described below with reference to embodiments.

Figure 1:
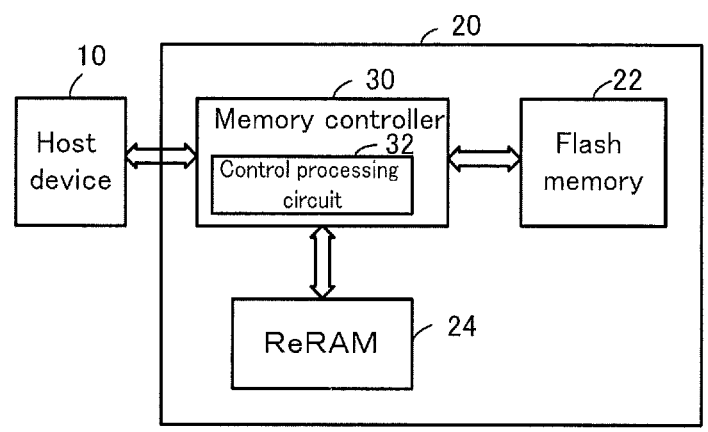
FIG. 1 is a diagram illustrating the schematic configuration of an SSD 20 according to an embodiment of the invention to store data from a host device 10.

FIG. 1 is a diagram illustrating the schematic configuration of an SSD (Solid State Drive) 20 according to an embodiment of the invention to store data from a host device 10 such as a personal computer. The SSD 20 is configured as a high-capacity data storage device to store various application programs and various data and includes a flash memory 22 configured as a NAND flash memory, a ReRAM 24 configured as a resistance random access memory and a memory controller 30 configured to control the flash memory 22 and the ReRAM 24.

The flash memory 22 is configured as the NAND flash memory having a flash memory cell array (not shown) comprised of a plurality of flash memory cells, each having threshold voltage changed by injection of electrons into a floating gate or withdrawal of electrons from the floating gate, and includes a row decoder, a column decoder and a sense amplifier (none are shown) in addition to the flash memory cell array. The flash memory 22 writes and reads data in page unit (4 kilobytes in this embodiment) comprised of eight sectors (each 512 bytes in this embodiment) and deletes stored data in block unit (256 kilobytes in this embodiment) comprised of a plurality of pages. Write data is written into this flash memory 22 by a writing operation, which reads out data stored in the flash memory 22, rewrites data in sectors corresponding to the write data out of the read-out data with the write data in sector unit and writes the rewritten data in page unit into the flash memory 22. In the flash memory 22 of the embodiment, the writing speed at which data is written into the flash memory 22 and the reading speed at which data is read out from the flash memory 22 are 212 MB/s.

Figure 2:
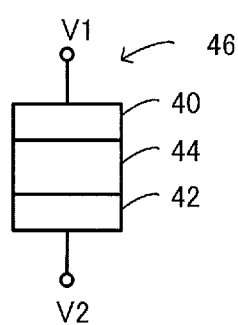
FIG. 2 is a diagram illustrating one exemplary structure of a resistance change element 46.

The ReRAM 24 is configured to have a ReRAM cell array (not shown) comprised of a plurality of ReRAM cells, each including a resistance change element 46 formed by placing a metal oxide 44 between an upper electrode 40 made of a metal such as titanium (Ti) or platinum (Pt) and a lower electrode 42 made of a metal such as titanium (Ti) or platinum (Pt) as shown in FIG. 2 and a MOS transistor (not shown) connected with the resistance change element 46, and includes a row decoder, a column decoder and a sense amplifier (none are shown) in addition to the ReRAM cell array. The ReRAM cell is provided as an element of a bipolar operation to be set (to low resistivity) when a voltage V1 applied to the upper electrode 40 is higher than a voltage V2 applied to the lower electrode 42 and to be reset (to high resistivity) when the voltage V1 is lower than the voltage V2. The ReRAM cell of such bipolar operation is generally provided as an element having relatively high operation speed and less power consumption, so that the ReRAM 24 is provided as a memory having relatively high operation speed and less power consumption. The metal oxide 44 may be preferably a metal oxide such as titanium oxide (TiOx), nickel oxide (NiOx), copper oxide (CuOx) or hafnium oxide (HfOx) or a multi-layered structure of such metal oxide. In the ReRAM 24 of this configuration, the writing speed at which data is written into the ReRAM 24 and the reading speed at which data is read out from the ReRAM 24 are higher than those of the flash memory 22 and are 1.25 GB/s according to this embodiment.

The memory controller 30 includes a control processing circuit 32 configured as a logic circuit having a plurality of logic elements to perform various controls and arithmetic operations. Various control signals and data are input into the control processing circuit 32 from the host device 10. Basically, the control processing circuit 32 controls the flash memory 22 and the ReRAM 24 to store data into the flash memory 22 and the ReRAM 24 based on input control signals, controls the flash memory 22 and the ReRAM 24 to read out data from the flash memory 22 and the ReRAM 24, and outputs read-out data to the host device 10. The control processing circuit 32 also makes conversion between logic addresses consisting of logic page addresses virtually representing pages for storage of data and logic sector addresses virtually representing sectors for storage of data and physical addresses representing the actual locations in the flash memory 22 or in the ReRAM 24 in the course of data reading or writing. The memory controller 30 is configured to transmit various control signals and data to and from the host device 10 at a relatively high speed (for example, about 1.25 GB/s).

Figure 3:
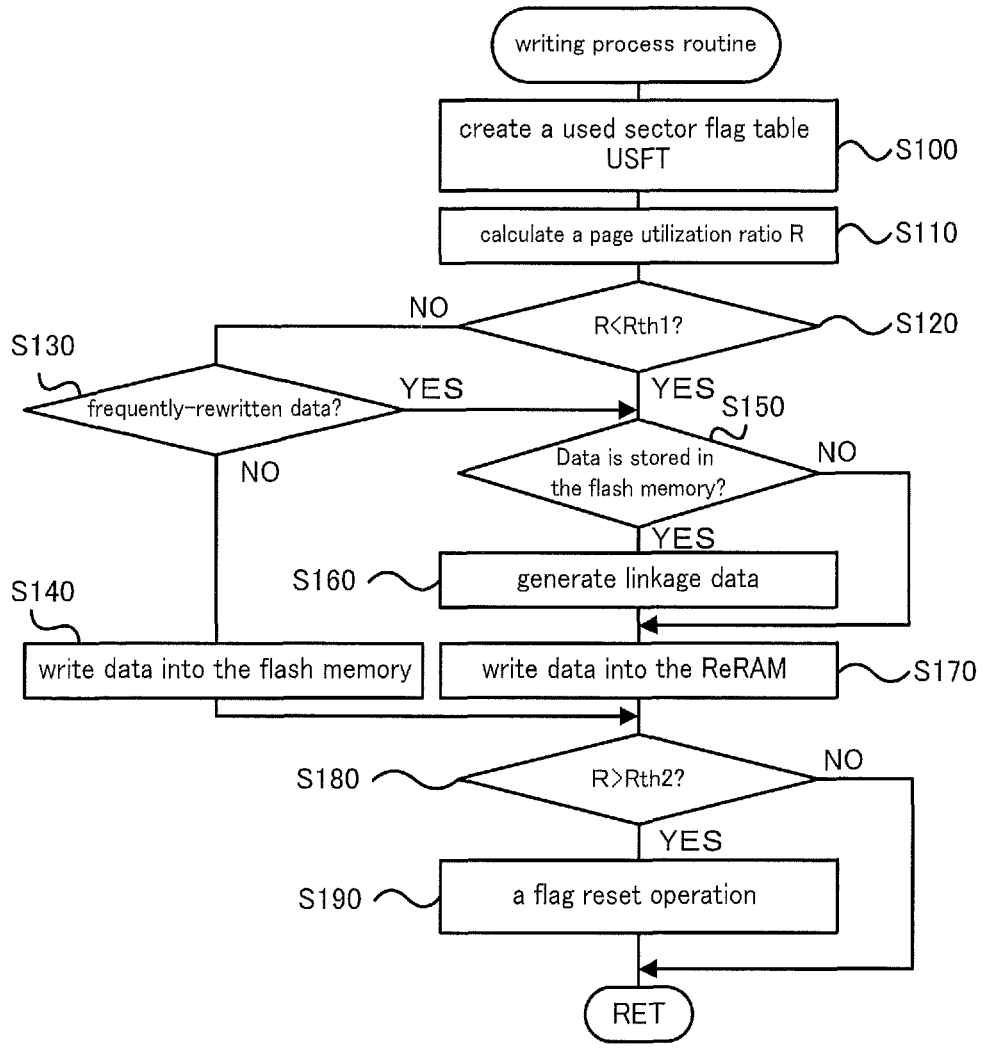
FIG. 3 is a flowchart showing an example of a writing process routine performed by a control processing circuit 32 of a memory controller 30.

The following describes the operations of the SSD 20 configured as described above or more specifically the operation of storing data input from the host device 10 into the flash memory 22 or the ReRAM 24. FIG. 3 is a flowchart showing an example of a writing process routine performed by the control processing circuit 32 of the memory controller 30. This routine is triggered by input of a write request signal to request for writing data from the host device 10 into the flash memory 22 or the ReRAM 24, write data and logic addresses consisting of logic page addresses and logic sector addresses representing the location in which the write data is to be stored.

In response to input of the write request signal, the control processing circuit 32 of the memory controller 30 creates a used sector flag table USFT (step S100) and calculates a page utilization ratio R which is a ratio of sectors used for storage of data at each logic page address, based on the used sector flag table USFT (step S110).

Figure 4:
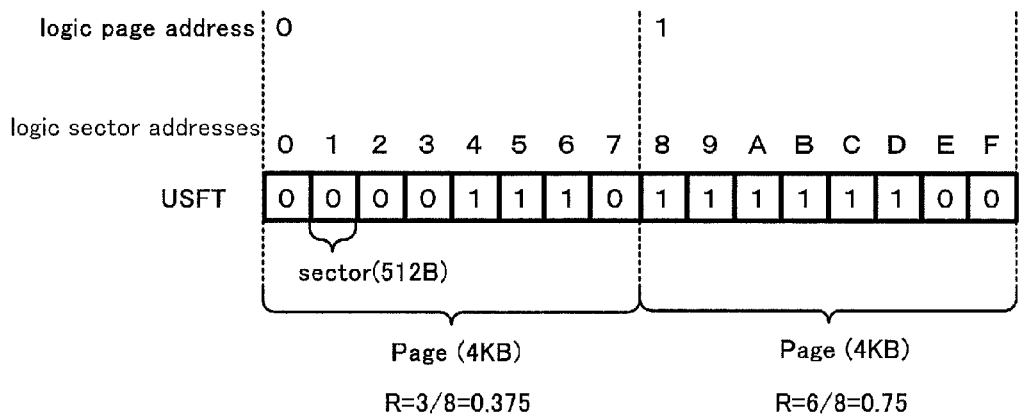
FIG. 4 is a diagram illustrating an example of a used sector flag table USFT and a page utilization ratio R.

FIG. 4 is a diagram illustrating an example of the used sector flag table USFT and the page utilization ratio R. The used sector flag table USFT has flags provided corresponding to the number of sectors. Value 0 is set to the flag for sectors not used for storage of data, whereas value 1 is set to the flag for sectors used for storage of data. One page consists of eight sectors, so that eight flags are set in each page. The page utilization ratio R is calculated by dividing the number of the flags with the setting of the value 1 included in one page by value 8 representing the number of flags included in one page. When the number of flags with the setting of the value 1 included in one page is equal to 3, the page utilization ratio R is equal to 0.375 (=3/8). When the number of flags with the setting of the value 1 included in one page is equal to 6, the page utilization ratio R is equal to 0.75 (=6/8).

Figure 5:
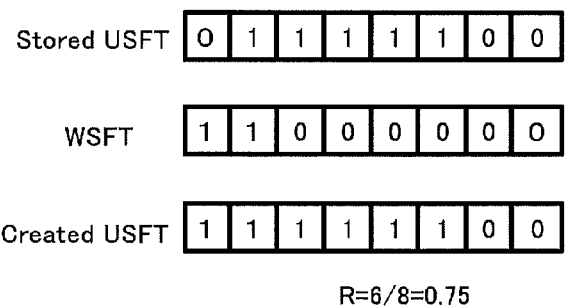
FIG. 5 is a diagram illustrating a process of creating the used sector flag table USFT.

The used sector flag table USFT is created (step S100) by implementing a logical add (OR) operation of a write data sector flag table WSFT, in which value 1 is set to the flag for sectors used for storage of write data and value 0 is set to the other flags, and the used sector flag table USFT stored in advance. For example, as shown in FIG. 5, when the used sector flag table USFT stored in advance is "01111100" and the write data sector flag table WSFT is "11000000", the used sector flag table USFT of "11111100" is created. In this case, the page utilization ratio R is equal to 0.75.

After calculation of the page utilization ratio R as described above, the control processing circuit 32 determines whether the page utilization ratio R is not lower than a threshold value Rth1 (step S120) and also determines whether the write data is frequently-rewritten data, which is rewritten at a relatively high frequency (step S130). Herein the threshold value Rth1 is set to decrease with an increase in size of data stored in the ReRAM 24. A concrete procedure of determining whether the write data is frequently-rewritten data stores latest 1000 logic addresses having the page utilization ratio R of not lower than the threshold value Rth1 in a storage table and determines that the write data is frequently-rewritten data when a specified number (for example, 100) or greater number of logic addresses of the write data are present in the storage table.

When the page utilization ratio R is not lower than the threshold value Rth1 and when the write data is not frequency-rewritten data (steps S120 and S130) the control processing circuit 32 controls the flash memory 22 to store the write data into the flash memory 22 by the writing operation described above (step S140). This series of processing enables data to be stored into the flash memory 22.

Figure 6:
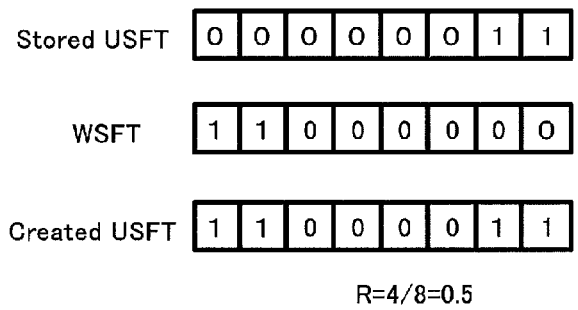
FIG. 6 is a diagram illustrating another process of creating the used sector flag table USFT.

As shown in FIG. 6, when the page utilization ratio R is lower than the threshold value Rth1, i.e., in the state that there are a relatively large number of unused sectors in a page (step S120), or when the write data is frequently-rewritten data although the page utilization ratio R is not lower than the threshold value RTh1 (step S130), the control processing circuit 32 determines that storage of data into the flash memory 22 accelerates deterioration of the flash memory 22 and performs a writing operation to write data into the ReRAM 24 (steps S150 to S170). The determination that storage of data into the flash memory 22 in the state that there are a relatively large number of unused sections in a page accelerates deterioration of the flash memory 22 is attributed to the following reason. Writing data into the flash memory 22 in this state may cause the writing operation to be performed for a storage area that is not used for storage of data under normal circumstances and may result in deterioration of the flash memory 22. Setting the threshold value Rth1 to decrease with an increase in size of data stored in the ReRAM 24 suppresses data from being stored in the ReRAM 24 in the state that the vacant storage area is reduced in the ReRAM 24. This accordingly ensures data storage in the ReRAM 24 appropriately even in the case of using the ReRAM 24 of relatively small storage capacity.

The writing operation of writing data into the ReRAM 24 first determines whether data corresponding to the logic addresses of the write data is stored in the flash memory 22 (step S150). When such data is stored in the flash memory 22, the control processing circuit 23 generates linkage data by reading out data having addresses corresponding to the logic addresses of the write data in page unit from the flash memory 22 and overwriting the read-out data corresponding to the write data with the write data in sector unit (step S160), controls the ReRAM 24 to store the linkage data into the ReRAM 24 (step S170). When no such data is stored in the flash memory 22, on the other hand, the control processing circuit 23 controls the ReRAM 24 to store the write data into the ReRAM 24 (step S170). As described above, when the page utilization ratio R is lower than the threshold value Rth1 or when the write data is frequently-rewritten data although the page utilization ratio R is not lower than the threshold value Rth1, storing the write data into the ReRAM 24 suppresses deterioration of the flash memory 22. The writing speed of the ReRAM 24 is higher than the writing speed of the flash memory 22, so that storing the write data into the ReRAM 24 ensures the higher-speed writing operation.

After storing the write data into either the flash memory or the ReRAM 24, the control processing circuit 23 subsequently determines whether the page utilization ratio R exceeds a threshold value Rth2 (for example, 0.85) specified in advance as a higher value than the threshold value Rth1 (step S180). When the page utilization ratio R is higher than the threshold value Rth2, a flag reset operation is performed to set all the flags in the used sector flag table USFT to the value 0 (step S190). When the page utilization ratio R is not lower than the threshold value Rth2, this routine is terminated without changing the settings of the used sector flag table USFT. This flag reset operation is performed, because of the following reason.

For example, as shown in FIG. 7, when the used sector flag table USFT stored in advance is "01111111" (page utilization ratio R is equal to 0.875) and the write data sector flag table WSFT is "11000000", the used sector flag table USFT of "11111111" is created. In the state of the high page utilization ratio R, unless the data is frequently-rewritten data, the data of this page may be always stored in the flash memory 22 by the writing operation. This may result in accelerating deterioration of the flash memory 22. When the page utilization ratio R is higher than the threshold value Rth2, however, the flag reset operation is performed (step S190) to set all the flags of the used sector flag table USFT to the value 0. As shown in FIG. 8, the flag reset operation causes the used sector flag table USFT stored in advance to be "00000000" (page utilization ratio R equal to the value 0) at step S100 in a next cycle. When the write data sector flag table WSFT is "11000000", the used sector flag table USFT of "11000000" is created. The used sector flag table USFT accordingly indicates information of the sectors used for storage of data after the page utilization ratio R becomes higher than the threshold value Rth2. The page utilization ratio R in this state is equal to 0.25, so that the write data is written into the ReRAM 24 (steps S120 and S150 to S170). This series of processing suppresses the writing operation of data into the flash memory 22 and thereby suppresses deterioration of the flash memory 22.

The SSD 20 of the embodiment described above stores the write data into the ReRAM 24 when the page utilization ratio R is lower than the threshold value Rth1 or when the write data is frequently-rewritten data although the page utilization ratio R is not lower than the threshold value Rth1. This suppresses deterioration of the flash memory 22. The writing speed of the ReRAM 24 is higher than the writing speed of the flash memory 22, so that storing the write data into the ReRAM 24 ensures the higher speed writing operation. Setting the threshold value Rth1 to decrease with an increase in size of the storage area for storing data in the ReRAM 24 suppresses the write data from being stored into the ReRAM 24 in the state that the vacant storage area is reduced in the ReRAM 24. This accordingly ensures data storage in the ReRAM 24 appropriately even in the case of using the ReRAM 24 of relatively small storage capacity. Additionally, when the page utilization ratio R is higher than the threshold value Rth2, the flat reset operation is performed to set all the flags in the used sector flag table USFT to the value 0. This suppresses the writing operation of data into the flash memory 22 and accordingly suppresses deterioration of the flash memory 22.

The SSD 20 of the embodiment stores the write data into the ReRAM 24 when the write data is frequently-rewritten data although the page utilization ratio R is not lower than the threshold value Rth1 (steps S120, S130 and S150 to S170). A modification may omit the processing of step S130 and may uniformly store the write data into the flash memory 22 when the page utilization ratio is not lower than the threshold value Rth1 (steps S120 to S140).

The SSD 20 of the embodiment sets the threshold value Rth1 to decrease with an increase in size of the storage area for storing data in the ReRAM 24. A modification may set the threshold value Rth1 to a fixed value irrespective of the size of the storage area for storing data in the ReRAM 24.

The SSD 20 of the embodiment performs the flag reset operation to set all the flags in the used sector flag table USFT to the value 0 when the page utilization ratio R is higher than the threshold value Rth2 (steps S180 and S190). A modification may omit this operation.

The SSD 20 of the embodiment sets the object range of calculation of the page utilization ratio R to 1 page and calculates the page utilization ratio R by dividing the number of flags with the settings of the value 1 included in one page by the value 8 representing the number of flags included in one page. The object range of calculation of the page utilization ratio R may, however, be any size greater than one sector. For example, a modification may set the object range of calculation of the page utilization ratio R to 2 or a greater number of pages and calculates the page utilization ratio R by dividing the number of flags with the settings of the value 1 included in the object range to the number of flags included in the object range.

The SSD 20 of the embodiment has the flash memory 22. A modification may replace the flash memory 22 with another memory configured as a non-volatile memory in which data can be written by a writing operation that reads out data stored in a storage area in page unit consisting of a plurality of sectors, rewrites the read-out data in sector unit and subsequently writes the rewritten data in page unit.

In the SSD 20 of the embodiment, the ReRAM cell of the ReRAM 24 is configured as the element of bipolar operation. The ReRAM cell may be comprised of the resistance change element 46 and a diode (not shown) and may be configured as an element of unipolar operation to be set (to low resistivity) under application of a higher voltage than the voltage V2 to the voltage V1 and to be reset (to high resistivity) under application of a voltage higher than the voltage V2 but lower than the voltage for setting the ReRAM cell to the voltage V1. The ReRAM cell of such unipolar operation generally has the smaller cell size and the simpler cell structure than the ReRAM cell of the bipolar operation. Compared with the configuration of the ReRAM cell as the element of the bipolar operation, this configuration of the ReRAM cell as the element of the unipolar operation further reduces the required area with a slight decrease in operation speed.

The SSD 20 of the embodiment has the ReRAM 24. A modification may replace the ReRAM 24 with a random access memory in which data can be written at a higher speed than the other flash memory 22: for example, a ferroelectric random access memory with a capacitor having a ferroelectric material placed between two electrodes, a magnetoresistive random access memory with an MTJ (magneto tunnel junction) element having a tunnel magnetoresistive film placed between magnetic films, a phase change random access memory with an element having a phase change material placed between two electrodes, a static random access memory or a dynamic random access memory.

The embodiment describes application of the invention to the SSD. The invention is, however, applicable to any data processing device configured to process data, for example, a USB memory. The invention is not restricted to the configuration of mounting the memory controller 30 on one device, the SSD 20. The flash memory 22, the ReRAM 24 and the memory controller 30 may be mounted respectively on different devices. The flash memory 22 and the ReRAM 24 may be mounted on one identical device, and the memory controller 30 may be mounted on a different device from the device on which the memories 22 and 24 are mounted. The invention may also be implemented as a memory control method of controlling the flash memory 22 and the ReRAM 24.

The following describes the correspondence relationship between the primary components of the embodiment and the primary components of the invention described in Summary of Invention. With regard to the memory controller, the control processing circuit 32 of the embodiment corresponds to the "controller". With regard to the memory controller, the control processing circuit 32 corresponds to the "controller". With regard to the data storage device, the memory controller 30 corresponds to the "memory controller", the flash memory 22 corresponds to the "first memory" and the ReRAM 24 corresponds to the "second memory.

The aspect of the invention is described above with reference to the embodiment. The invention is, however, not limited to the above embodiment but various modifications and variations may be made to the embodiment without departing from the scope of the invention.

INDUSTRIAL APPLICABILITY

The present invention is applicable to, for example, the manufacturing industries of memory controllers and data storage devices.

The invention claimed is:

1. A memory controller configured to control a first memory and a second memory, wherein the first memory is configured as a non-volatile memory in which data can be written by a writing operation, and the second memory is configured as a random access memory in which data can be written at a higher speed than the first memory, the memory controller comprising:
a controller configured to control the first memory and the second memory in response to input of write data and a write request signal to request for writing the write data, such that the input write data is written into the first memory by the writing operation when a data utilization ratio is not lower than a specified ratio and such that the input write data is stored into the second memory when the data utilization ratio is lower than the specified ratio, wherein the data utilization ratio denotes a ratio of a size of sectors used for storage of the write data to a size of a data storable area in a predefined range of a storage area in the first memory in the case where the write data is written into the first memory; and an address information storage unit configured to store a first number of logic addresses of the input write data when the data utilization ratio is not lower than the specified ratio, wherein:

the controller controls the first memory and the second memory, such that the input write data is stored into the second memory when the write data is frequently-written data which is written at a high frequency although the data utilization ratio is not lower than the specified ratio, and the controller determines that the input write data is the frequently-written data when a number of logic addresses of the input write data stored in the address information storage unit is not lower than a second number which is smaller than the first number.

2. The memory controller according to claim 1, further comprising:

a ratio setter configured to set the specified ratio to decrease with an increase in a size of a storage area for storing data in the second memory.

3. The memory controller according to claim 1, wherein the controller calculates the data utilization ratio, based on used sector information which is information on whether each of the sectors stores data, and sectors used for storing the input write data.

4. The memory controller according to claim 3, wherein when the data utilization ratio becomes equal to a second ratio higher than the specified ratio, the controller specifies information on whether each of the sectors stores data after the data utilization ratio becomes equal to the second ratio, as the used sector information.

5. The memory controller according to claim 1, wherein in the case of storing the input write data into the second memory, when data corresponding to logic addresses of the input write data have already been stored in the storage area of the first memory, the controller reads out data stored in the first memory, rewrites the data as a writing object and subsequently stores the rewritten data into the second memory.

6. The memory controller according to claim 1, wherein the predefined range is a range for data of one page corresponding to logic addresses of the write data.

7. The memory controller according to claim 1, wherein the first memory is a NAND flash memory.

8. The memory controller according to claim 1, wherein the second memory is a resistance change memory.

9. A data storage device, comprising:
the memory controller according to claim 1;
the first memory; and
the second memory.

10. A memory controller configured to control a first memory and a second memory, wherein the first memory is configured as a non-volatile memory in which data can be written by a writing operation, and the second memory is configured as a random access memory in which data can be written at a higher speed than the first memory, the memory controller comprising:

a controller configured to control the first memory and the second memory in response to input of write data and a write request signal to request for writing the write data, such that the input write data is written into the first memory by the writing operation when a data utilization ratio is not lower than a specified ratio and such that the input write data is stored into the second memory when the data utilization ratio is lower than the specified ratio, wherein the data utilization ratio denotes a ratio of a size of sectors used for storage of the write data to a size of a data storable area in a predefined range of a storage area in the first memory in the case where the write data is written into the first memory, wherein:

the controller calculates the data utilization ratio, based on used sector information which is information on whether each of the sectors stores data, and sectors used for storing the input write data; and when the data utilization ratio becomes equal to a second ratio higher than the specified ratio, the controller specifies information on whether each of the sectors stores data after the data utilization ratio becomes equal to the second ratio, as the used sector information.

11. The memory controller according to claim 10, further comprising:

a ratio setter configured to set the specified ratio to decrease with an increase in a size of a storage area for storing data in the second memory.

12. The memory controller according to claim 10, wherein in the case of storing the input write data into the second memory, when data corresponding to logic addresses of the input write data have already been stored in the storage area of the first memory, the controller reads out data stored in the first memory, rewrites the data as a writing object and subsequently stores the rewritten data into the second memory.

13. The memory controller according to claim 10, wherein the predefined range is a range for data of one page corresponding to logic addresses of the write data.

14. The memory controller according to claim 10, wherein the first memory is a NAND flash memory.

15. The memory controller according to claim 10, wherein the second memory is a resistance change memory.

16. A data storage device, comprising:
the memory controller according to claim 10,
the first memory; and
the second memory.

* * * * *